United States Patent [19]

Choi

[11] Patent Number: 5,466,619
[45] Date of Patent: Nov. 14, 1995

[54] METHOD FOR FABRICATING A THIN FILM TRANSISTOR

[75] Inventor: Jong M. Choi, Seoul, Rep. of Korea

[73] Assignee: Goldstar Electron Co., Ltd.

[21] Appl. No.: 208,647

[22] Filed: Mar. 9, 1994

[30] Foreign Application Priority Data

Feb. 1, 1994 [KR] Rep. of Korea .................... 1994-1813

[51] Int. Cl.$^6$ ......................... H01L 21/266; H01L 21/84
[52] U.S. Cl. ........................... 437/41; 437/101; 437/909
[58] Field of Search ............................... 437/41, 40, 909, 437/21, 101, 187, 44, 162

[56] References Cited

U.S. PATENT DOCUMENTS

| | | | |
|---|---|---|---|
| 4,975,385 | 12/1990 | Beinglass et al. | 437/44 |
| 5,202,276 | 4/1993 | Malhi | 437/41 |
| 5,212,105 | 5/1993 | Kizu et al. | 437/44 |

FOREIGN PATENT DOCUMENTS

| | | | |
|---|---|---|---|
| 2-1941A | 1/1990 | Japan | 437/41 |
| 4162537A | 6/1992 | Japan | 437/21 |

OTHER PUBLICATIONS

Paper Entitled "A Polysilicon Transistor Technology For Large Capacity SRAMs" By S. Ikeda, et al., Presented At The International Electron Devices Meeting On Dec. 9–12, 1990.

Paper Entitled "High Reliability And High Performance 0.35MM Gate–Inverted TFT's For 16MBIT SRAM Applications Using Self–Aligned LDD Structures" By C. T. Liu, et al., Presented At The International Electron Device Meeting On Dec. 13–16, 1992.

*Primary Examiner*—Olik Chaudhuri
*Assistant Examiner*—Richard A. Booth
*Attorney, Agent, or Firm*—Poms, Smith, Lande & Rose

[57] ABSTRACT

A method for fabricating a thin film transistor including the steps of forming a gate electrode on a substrate; successively depositing a gate insulation layer and a semiconductor layer on the substrate; forming sidewall from semiconductor layer on both said surfaces of the gate electrode by an anisotropic dry etching process; and implanting ions into the semiconductor sidewall. The grain boundaries in the source and drain junctions but not parallel to the channel. prevent leakage current. Thus, the on-to-off current ratio is improved and the device can be designed with a reduced cell size having no off-set margins.

14 Claims, 6 Drawing Sheets

METHOD FOR FABRICATING A THIN FILM TRANSISTOR

FIELD OF THE INVENTION

The present invention relates to a method for fabricating a semiconductor device and more particularly to a method for fabricating a thin film transistor for a memory cell of a static random access memory.

BACKGROUND OF THE INVENTION

Generally, while a thin film transistor (TFT) is widely used as a switching element for switching the pixel data and formed in the respective pixel area of liquid crystal display (LCD), it also can be used as a load resistor in a static random access memory (SRAM) with memory capacities of 1 Mb.

The circuit diagram of FIG. 1 is the memory cell of a SRAM which employs a p channel TFT as a load element instead of the load resistor.

A memory cell unit or basic storage cell consists of a single flip-flop having cross-coupled inverters, whereby each of the inverters includes n channel MOS transistors Q1, Q2 and p channel TFT Q5, Q6 used as a load.

The data lines B/L, *B/L (here * means the bar) are connected to the source and drain of n channel MOS transistors Q3, Q4 in memory cell unit whose gate is connected to the word line W/L.

The data of logic "1" can be written to the selected cell by applying high and low level signals into the bit lines B/L and *B/L, respectively. This state causes transistor Q1 to turn off and transistor Q2 to turn on, thereby charging up the node point N1 through a transistor Q3 and continuing to retain the stored data.

Conversely, the data of logic "0" can be written to the selected cell by applying low and high level signals into the bit lines B/L and *B/L, respectively. Such a state causes transistor Q1 to turn on and transistor Q2 to turn off, thereby charging up node point N2 through a transistor Q4 and continuing to retain the stored data.

The standby current Isb can be expressed as the sum of the off current Ioff of PMOS transistor Q6 and the leakage current Ileak of NMOS transistor Q1 as follows:

$$Isb = Ioff + Ileak \quad (1)$$

The leakage current Ileak of NMOS transistor Q1, which is generally about 10 fA, must be smaller than the on current Ion of PMOS transistor Q5 (that is, Ion>Ileak×100).

Accordingly, in SRAMs with capacities of 4 Mb having the standby current Isb above 1 µA, the current value of 250 fA per the unit cell can be obtained and then it is known that Ileak≈10 fA/cell, Ioff≦250 fA/cell from the above Eq.(1).

To make high quality SRAM having reduced power consumptions and improved data retention features means, the off current of the PMOS transistor must be reduced and the on current increased.

The recent research being based upon such a principle is developed with the aim of improving the ratio of on to off current.

With reference to the accompanying drawings, the conventional method for fabricating p type TFT with an object of an improvement of the on/off current ratio is simply described.

FIGS. 2a and 2D are sectional views showing the conventional process for fabricating a p type TFT and FIG. 3 illustrates the lattice structure associated with the body polycrystalline silicon layer of the p type TFT. The main features in fabricating the conventional p type MOS transistor reside in the formation of the larger grain size of body polycrystalline silicon layer being based upon the bottom gate through the solid phase growth process.

The solid phase growth process is carried out through a long time annealing for about 24 hours in the vicinity of 600° C.

Referring to FIG. 2A, a polycrystalline silicon layer deposited onto an insulated substrate 1 or insulating layer is patterned to form a gate electrode 2 by the conventional photolithography process using the mask having a featured gate electrode pattern therein.

And as shown in FIG. 2B, on the entire surface of the substrate are successively provided a gate insulation layer 3 and a body polycrystalline silicon layer 4 by chemical vapor deposition (CVD) method.

As the solid phase growth process, the annealing step at about 600° C. for 24 hours is performed to obtain the large grain size of the body polycrystalline silicon layer 4.

The channel area is masked by the patterned photoresist layer through the exposure and development of the coated resist layer on the body polycrystalline silicon layer 4.

The masking area covering the channel area is defined so as to produce the overlapped portion between the source area 6a to be formed and the gate electrode 2, and to secure the off-set between the drain area 6b and the gate electrode 2 to be formed. In the drawing, a, b, c and d denote a source area, a channel area, an off-set area and a drain area, respectively.

The source and drain areas 6a and 6b are formed by the ion implantation of p-type impurity such as BF2 into the revealed body polycrystalline silicon layer 4, ultimately to form a p type TFT.

So as to obtain an improved p type TFT, the grain size has been increased by the solid phase growth process, but the channel area as indicated as b in FIG. 3 has the grain boundary that reduces the on current of the TFT. Further the grain boundary is also across both ends of the respective junctions of the source and drain, thereby increasing the off current.

SUMMARY OF THE INVENTION

It is an object of this invention to provide a thin film transistor having an improved on/off current ratio.

According to the present invention, a method for fabricating a thin film transistor comprises the step of:

forming a gate electrode on a substrate;

successively depositing a gate insulation layer and a semiconductor layer on the whole substrate;

forming a side wall of a semiconductor on both side surfaces of the gate electrode by an anisotropic dry etching the semiconductor layer; and forming a source and drain junction by selectively implanting ions into the sidewall.

DETAILED DESCRIPTION OF THE INVENTION

The present invention will now be described more specifically with reference to the drawings attached.

Figure 1:
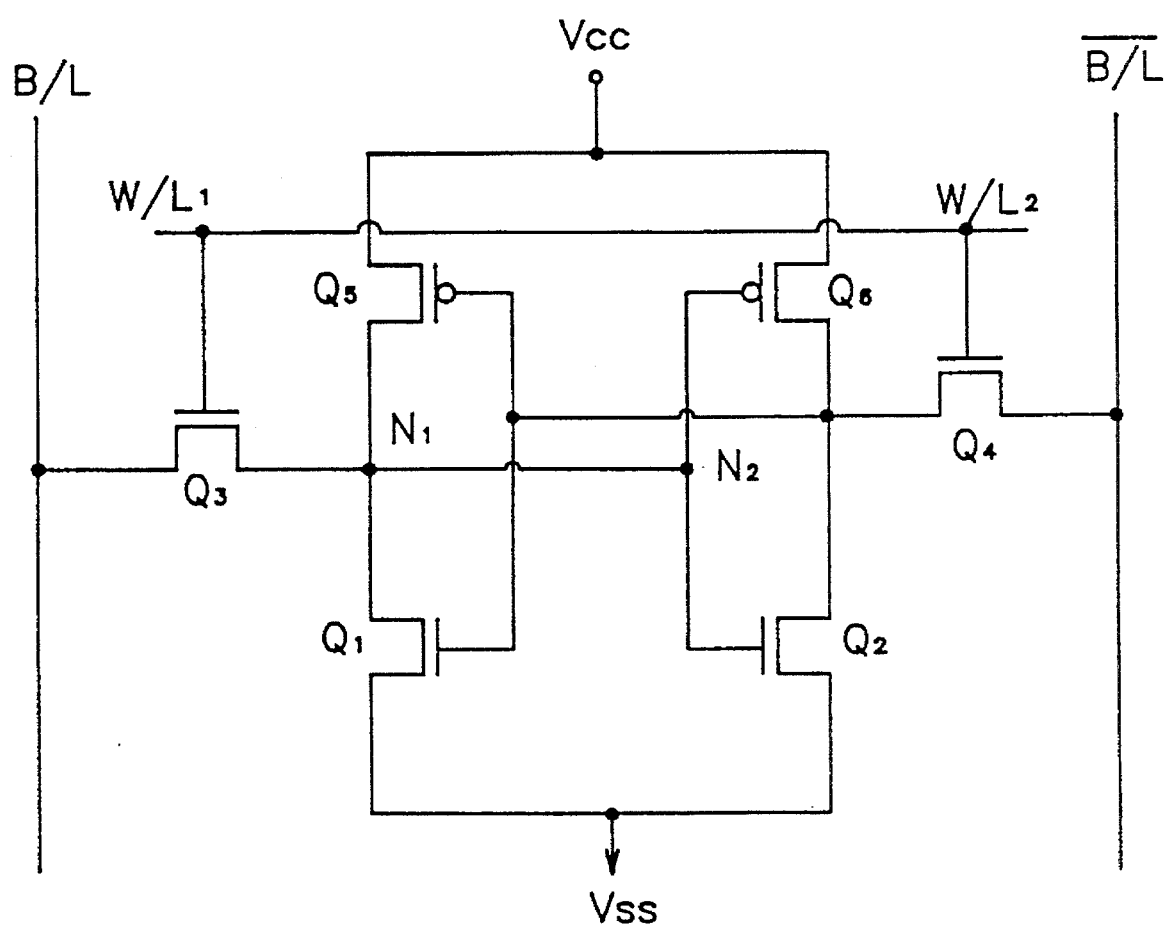
FIG. 1 is a circuit diagram showing a conventional CMOS SRAM.
Figure 2A:
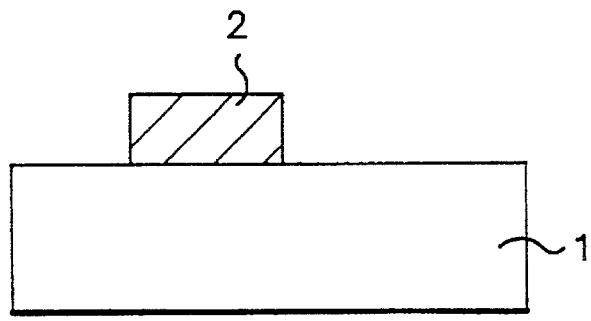
FIGS. 2A to 2D are sectional views explaining a conventional process of manufacturing p type TFTs.
Figure 2B:
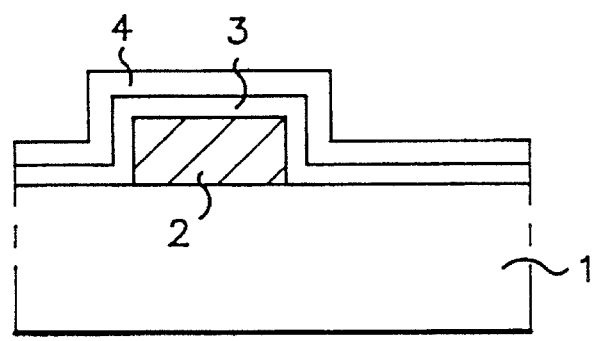
Figure 2C:
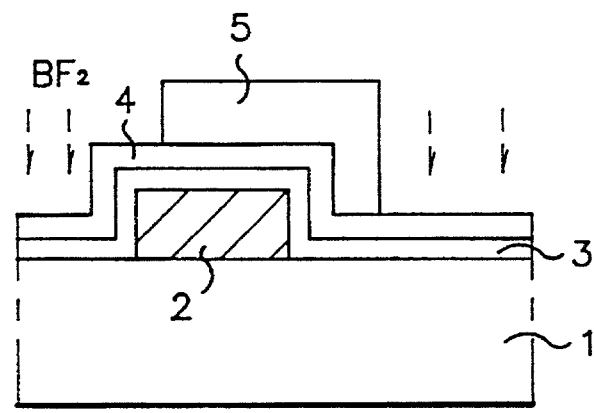
Figure 2D:
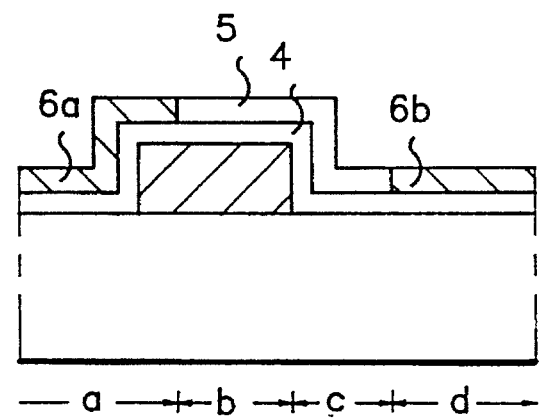
Figure 3:
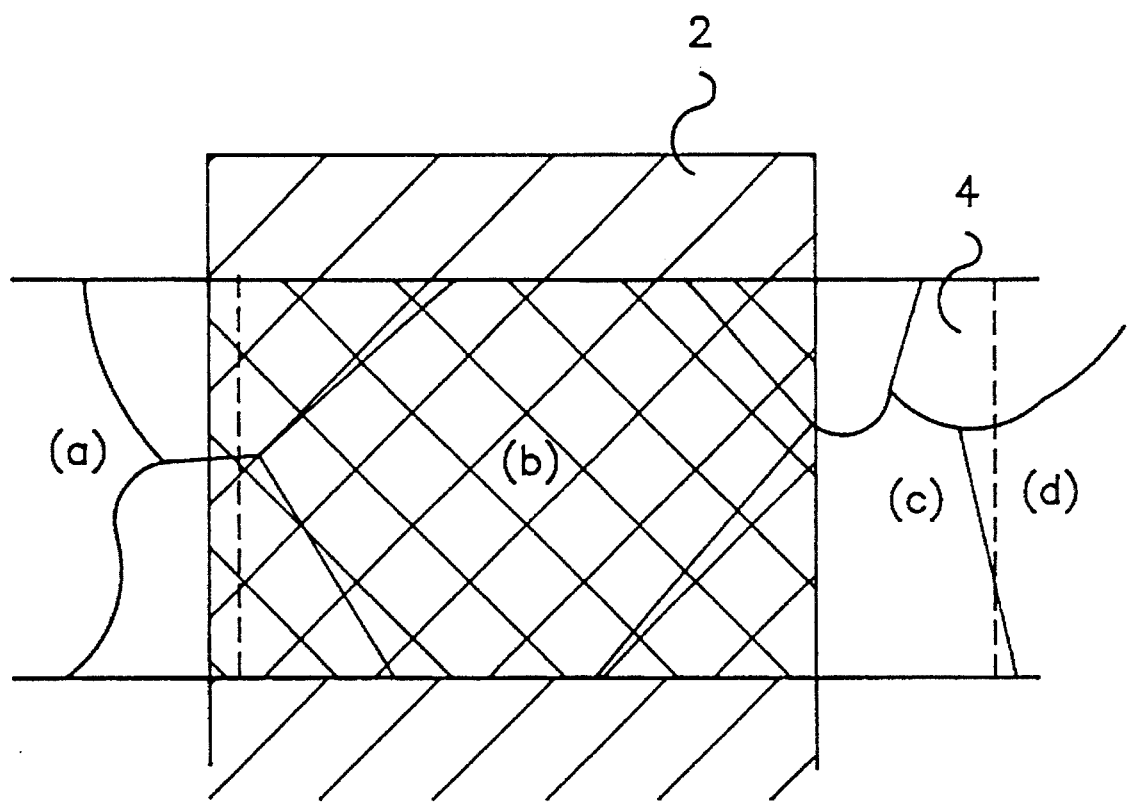
FIG. 3 is a sectional view of the body polycrystalline layer of the conventional p type TFT.
Figure 4A:
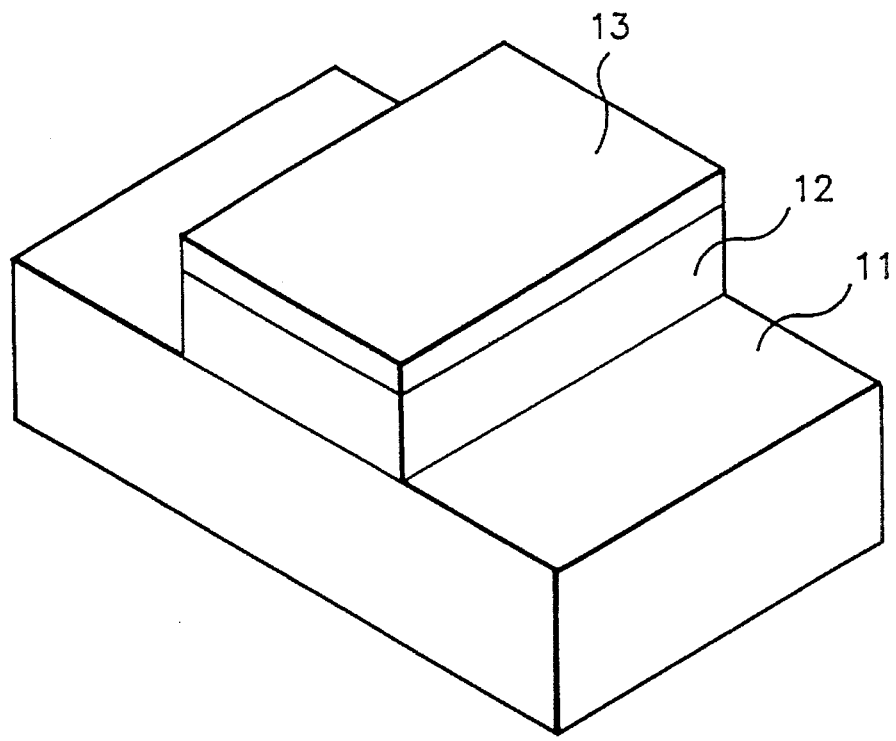
FIGS. 4A to 4D are perspective and sectional views explaining a process of manufacturing p type TFTs according to the present invention.
Figure 4B:
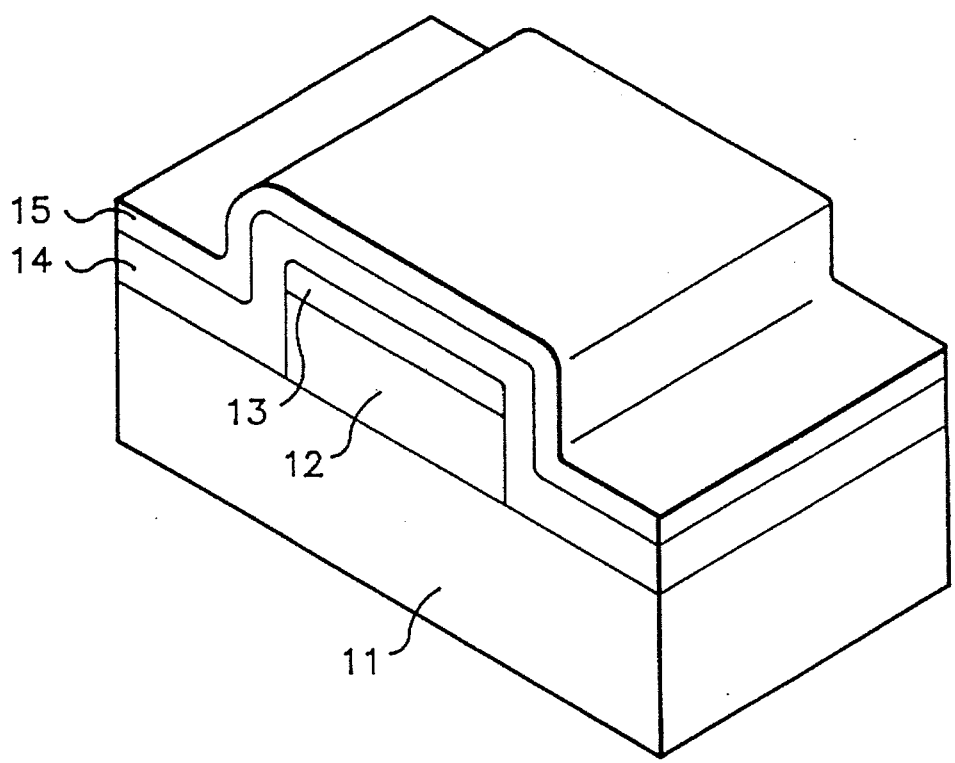
Figure 4C:
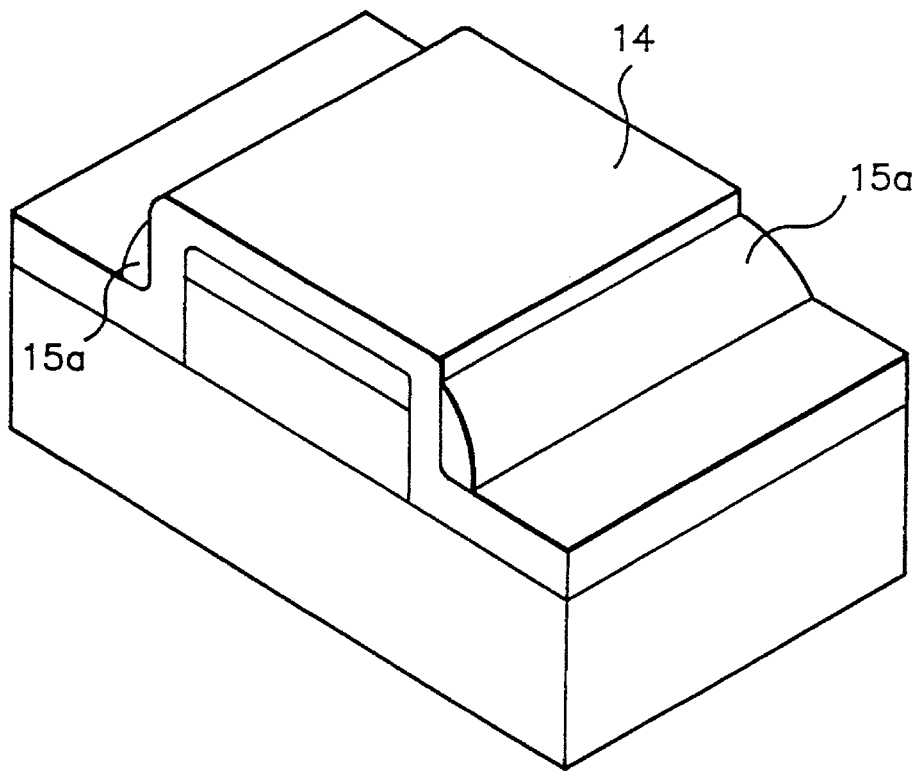
Figure 5:
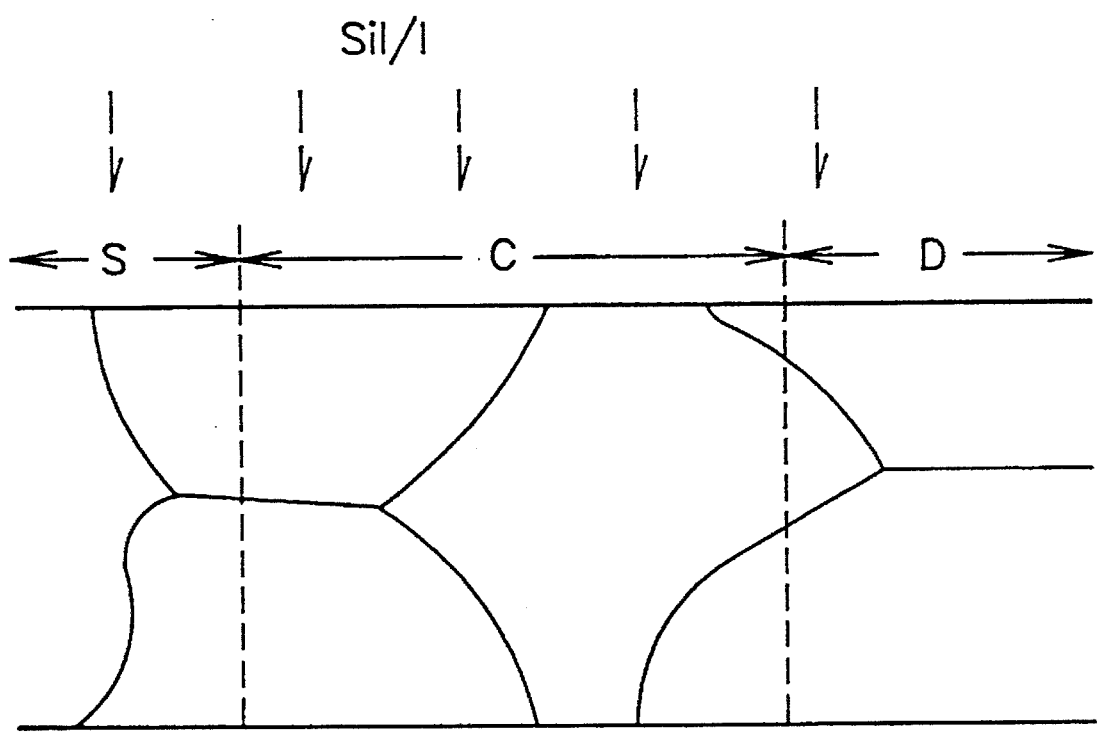
FIG. 5 shows a body polycrystalline layer of a p type TFT according to the present invention.
Figure 5:
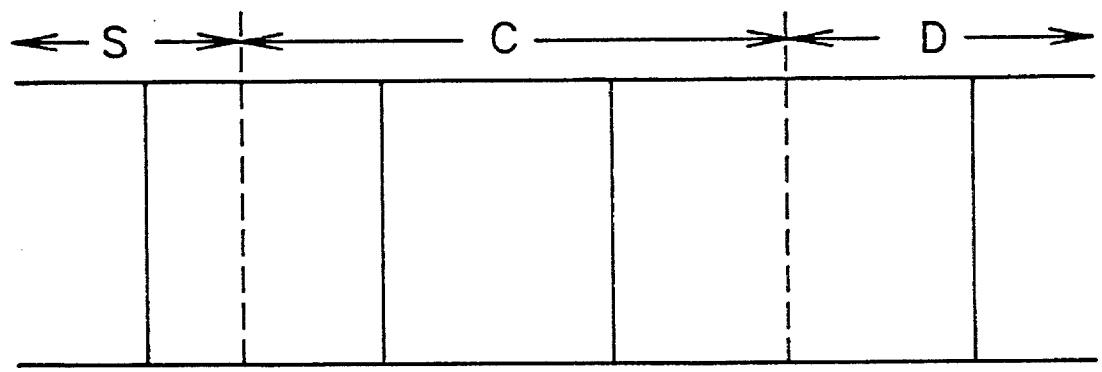

FIGS. 4A to 4B are perspective and sectional views showing the steps of manufacturing a TFT according to the present invention and FIG. 5 shows a body polycrystalline layer of a TFT according to the present invention.

Referring to FIG. 4A, on an insulated substrate 11 or insulating layer a polycrystalline silicon layer having the thickness of 100 Å to 10000 Å is deposited followed by the deposition of an insulating layer of an oxide layer or the like thereon. Then, the polycrystalline silicon and oxide layer are patterned to form a gate electrode 12 and insulating layer 13 capping the gate electrode (the cap gate insulating layer) by the photolithography techniques using the mask having the featured gate electrode pattern therein.

The formation step of the cap gate insulating layer 13 may be skipped, but the formed cap gate insulating layer protects the gate insulation layer from damage due to the high energy required for the silicon ion implantation.

As shown in FIG. 4B, on the entire surface of the substrate is formed the gate insulation layer 14 having a thickness of 50 Å to 800 Å on which a body polycrystalline silicon layer 15 is successively deposited. The body polycrystalline layer has the grains formed by the solid phase growth process undergone at 500° C. to 850° C. for 30 minutes to 72 hours in a preferred embodiment.

And the grown body polycrystalline silicon layer 15 is vertically etched to form a side wall 15a of the polycrystalline silicon on both side surfaces of the gate insulation layer 14 formed on the side and top surfaces of the gate electrode.

Continuously, the silicon ion implantation is applied to the side wall 15a of the polycrystalline silicon layer, to remove the grain boundaries parallel to the channel, whereby the sidewalls are implanted with a dopant concentration of $10^{11}$ to $10^6$ atoms/cm$^2$ at 10 to 300 keV. The re-crystallization of the substrate leaves the grain boundaries having only the vertical direction component along with the channel.

Figure 4D:
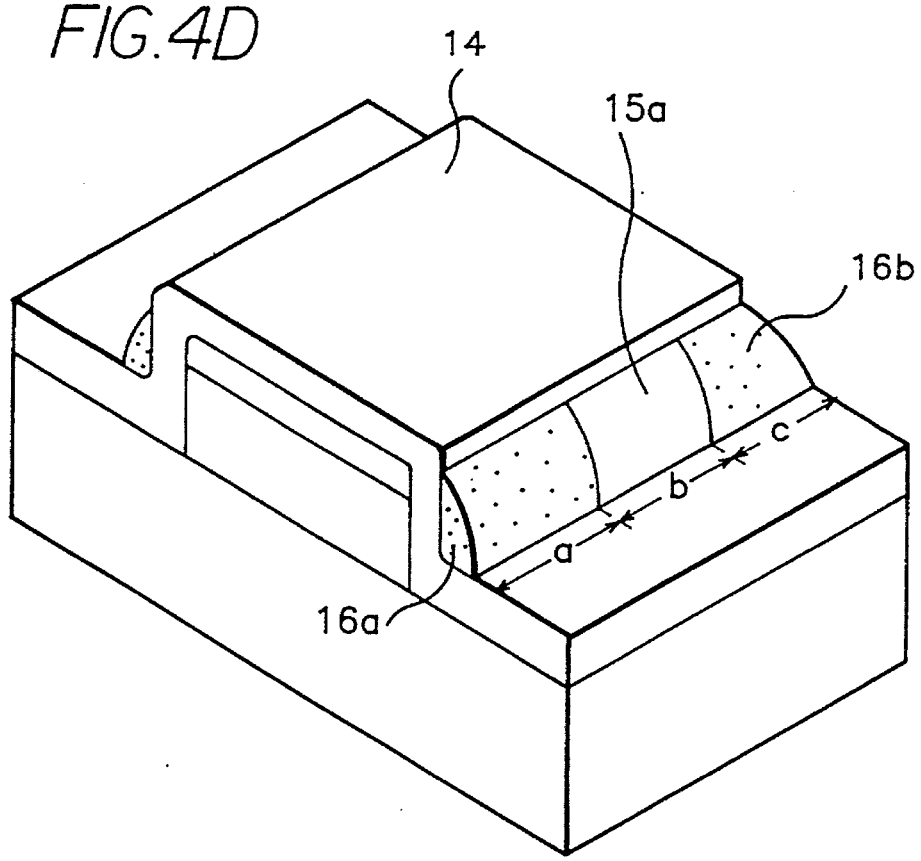

As shown in FIG. 4D, a channel area to be formed in the side wall is defined by the patterned photo mask (not shown) and the subsequent ion implantation with p+ type impurities toward the wall forms source and drain regions 16a and 16b, which are overlapped with the gate electrode 12.

It should be noted that the grain boundaries parallel to the channel in the body polycrystalline layer formed by the solid phase growth method are all removed by the silicon ion implantation.

The process which has been described as above exhibits the following advantages:

First, the grain boundaries in the source and drain junction, but not parallel to the channel result in the prevention of the leakage current generation due to the electron hole pair generation. Therefore it is not necessary to secure off-set margin between the source and drain and the gate electrode. Accordingly, the ratio of on to off current is improved by an increased on current and decreased off current.

Second, the formation of the cap gate insulating layer protects the gate insulation layer from damage due to the required high energy for the silicon ion implantation.

Finally, the leakage current due to the grain boundary can be reduced even without the off-set. The reduced cell size by no off-set margin can afford to form the body polycrystalline film of the smaller channel width and thereby to make the semiconductor device with high density.

What is claimed is:

1. A method for fabricating a thin film transistor, comprising the steps of:

forming a gate electrode on a substrate;

successively and conformally depositing a gate insulation layer and a semiconductor layer on the substrate and on the gate electrode;

forming sidewall spacers from the semiconductor layer on portions of the gate insulation layer formed on sidewalls of the gate electrode by an anisotropic dry etching process; and forming source and drain junctions in the same semiconductor sidewall spacer by implanting ions into the semiconductor sidewall spacers.

2. A method for fabricating a thin film transistor, comprising the steps of:

forming a gate electrode on a substrate;

forming a gate insulation layer and semiconductor layer conformally thereon by a solid phase growth process;

forming sidewall spacers composed of a semiconductor on portions of the gate insulation layer formed on sidewalls of the gate electrode by anisotropically dry etching the semiconductor layer formed by the solid phase growth process; and forming source and drain junctions in the same semiconductor sidewall spacer by implanting ions into the semiconductor sidewall spacers.

3. A method of fabricating a thin film transistor, comprising the steps of:

forming a gate electrode on a substrate;

forming a gate insulation layer and semiconductor layer conformally thereon by a solid phase growth process;

forming sidewall spacers composed of a semiconductor on portions of the gate insulation layer formed on sidewalls of the gate electrode by anisotropically dry etching the semiconductor layer formed by the solid phase growth process;

implanting silicon ions into the sidewall spacers; and forming source and drain junctions in the same semiconductor sidewall spacer by implanting ions into the semiconductor sidewall spacers.

4. The method of claim 1, wherein the semiconductor layer is deposited to a thickness of 50 Å to 1000 Å.

5. The method of claim 1, wherein the gate electrode material comprises polycrystalline silicon.

6. The method of claim 1, wherein the gate electrode is formed to a thickness of 100 Å to 1000 Å.

7. The method of claim 1, further comprising the step of forming a cap gate insulating layer on the gate electrode.

8. The method of claim 2, wherein the semiconductor layer material comprises polycrystalline silicon.

9. The method of claim 2, wherein the solid phase growth process is carried out at a temperature of 500° C. to 600° C. for 30 minutes to 72 hours.

10. The method of claim 3, wherein the substrate is an insulative substrate.

11. The method of claim 3, wherein the substrate is a semiconductor substrate on which an insulation layer is formed.

12. The method of claim 3, wherein the silicon ions are implanted with doses of $10^{11}$ to $10^{16}$ atoms/cm$^2$ at 10 to 300 keV.

13. The method of claim 3, wherein the gate insulation layer is an oxide layer.

14. The method of claim 5, wherein the gate electrode is formed to a thickness of 100 Å to 10000 Å.

* * * * *